United States Patent
Herron et al.

(10) Patent No.: US 8,488,315 B2
(45) Date of Patent: Jul. 16, 2013

(54) POWER MODULE ASSEMBLIES WITH STAGGERED COOLANT CHANNELS

(75) Inventors: Nicholas Hayden Herron, Redondo Beach, CA (US); Brooks S. Mann, Redondo Beach, CA (US); Mark D. Korich, Chino Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 960 days.

(21) Appl. No.: 12/543,271

(22) Filed: Aug. 18, 2009

(65) Prior Publication Data

US 2011/0042038 A1 Feb. 24, 2011

(51) Int. Cl.
*H05K 7/20* (2006.01)

(52) U.S. Cl.
USPC ...... 361/689; 361/677; 361/679.46; 361/707; 165/104.11; 165/104.33; 257/712

(58) Field of Classification Search
USPC ....... 361/676–678, 679.46–679.54, 688–690, 361/696–702, 707, 710
See application file for complete search history.

(56) References Cited

U.S. PATENT DOCUMENTS

| | | | | |
|---|---|---|---|---|
| 5,675,473 A | * | 10/1997 | McDunn et al. | 361/699 |
| 6,245,442 B1 | | 6/2001 | Towata et al. | |
| 7,710,723 B2 | * | 5/2010 | Korich et al. | 361/699 |
| 7,835,151 B2 | * | 11/2010 | Olesen | 361/689 |
| 2007/0097627 A1 | * | 5/2007 | Taylor et al. | 361/689 |
| 2009/0107655 A1 | * | 4/2009 | Kajiura | 165/80.3 |

FOREIGN PATENT DOCUMENTS

JP 2008218828 A 9/2008

OTHER PUBLICATIONS

German Office Action, dated Aug. 28, 2012, issued in German Patent Application No. 10 2010 031 009.3.

* cited by examiner

*Primary Examiner* — Courtney Smith
(74) *Attorney, Agent, or Firm* — Ingrassia Fisher & Lorenz, P.C.

(57) ABSTRACT

A manifold is provided for supporting a power module assembly with a plurality of power modules. The manifold includes a first manifold section. The first face of the first manifold section is configured to receive the first power module, and the second face of the first manifold section defines a first cavity with a first baseplate thermally coupled to the first power module. The first face of the second manifold section is configured to receive the second power module, and the second face of the second manifold section defines a second cavity with a second baseplate thermally coupled to the second power module. The second face of the first manifold section and the second face of the second manifold section are coupled together such that the first cavity and the second cavity form a coolant channel. The first cavity is at least partially staggered with respect to second cavity.

17 Claims, 6 Drawing Sheets

POWER MODULE ASSEMBLIES WITH STAGGERED COOLANT CHANNELS

STATEMENT REGARDING FEDERALLY SPONSORED RESEARCH OR DEVELOPMENT

This invention was made with Government support under DE-FC26-07NT43123, awarded by the US-Department of Energy. The Government has certain rights in this invention.

TECHNICAL FIELD

The present invention generally relates to power module assemblies, and more specifically, to automobile power module assemblies with coolant channels.

BACKGROUND OF THE INVENTION

Alternative fuel vehicles, such as hybrid and fuel cell vehicles, include electric motors and other components that often use alternating current (AC) power supplies. However, the power supplies, such as batteries and fuel cells, used in such applications may only provide direct current (DC) power. Thus, a power inverter may be used to convert the DC power to AC power.

Modern automotive power inverters often utilize power module assemblies that include integrated circuits with multiple semiconductor devices (e.g., transistors and diodes) formed thereon to convert the DC power to AC power. Due to the high levels of current, the power modules may generate large amounts of heat. In order to ensure reliable performance, the power module assemblies typically have cooling systems to transfer heat out of the inverter assembly.

Conventional cooling systems used in automotive inverter assemblies often include a baseplate functioning as a heat sink mounted on the manifold of the power module assembly. Heat from the power modules is conducted through the power modules to the baseplates, where it is removed from the power module assembly by a coolant.

Simple heat sink cooling systems of the type described above may not achieve optimal power device cooling. For example, heat dissipation may be reduced by coolant stagnation. These limitations may be mitigated by employing an active cooling system, which utilizes a pump to circulate the coolant fluid over or onto the power device. However, even active cooling systems are also limited in certain respects. Such cooling systems tend to be relatively complex and expensive to employ.

Accordingly, it is desirable to have automotive power module assemblies that are compact in size, have fewer parts than conventional systems, provide improved cooling of the high power devices, and are of lower cost than conventional systems. Furthermore, other desirable features and characteristics of the present invention will become apparent from the subsequent detailed description and the appended claims, taken in conjunction with the accompanying drawings and the foregoing technical field and background.

SUMMARY OF THE INVENTION

In accordance with an exemplary embodiment, a manifold is provided for supporting a power module assembly with a plurality of power modules, including first and second power modules. The manifold includes a first manifold section having a first face and a second face. The first face of the first manifold section is configured to receive the first power module, and the second face of the first manifold section defines a first cavity with a first baseplate thermally coupled to the first power module. A second manifold section includes a first face and a second face. The first face of the second manifold section is configured to receive the second power module, and the second face of the second manifold section defines a second cavity with a second baseplate thermally coupled to the second power module. The second face of the first manifold section and the second face of the second manifold section are coupled together such that the first cavity of the first manifold section and the second cavity of the second manifold section form a coolant channel. The first cavity of the first manifold section is at least partially staggered with respect to second cavity of the second manifold section.

In accordance with another exemplary embodiment, a power module assembly includes a manifold and a plurality of power modules mounted on the manifold. The manifold defines a staggered coolant channel through which coolant flows to remove heat from the plurality of power modules.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-6 are merely illustrative and may not be drawn to scale.

FIGS. 1-6 illustrate an automobile and a power module assembly that may form part of an inverter assembly of the automobile. The power module assembly may include a manifold with first and second manifold sections. The manifold sections define cavities with baseplates that are thermally coupled to the power modules. The cavities form a staggered coolant channel in which coolant flows to remove heat away from the power modules.

Figure 1:
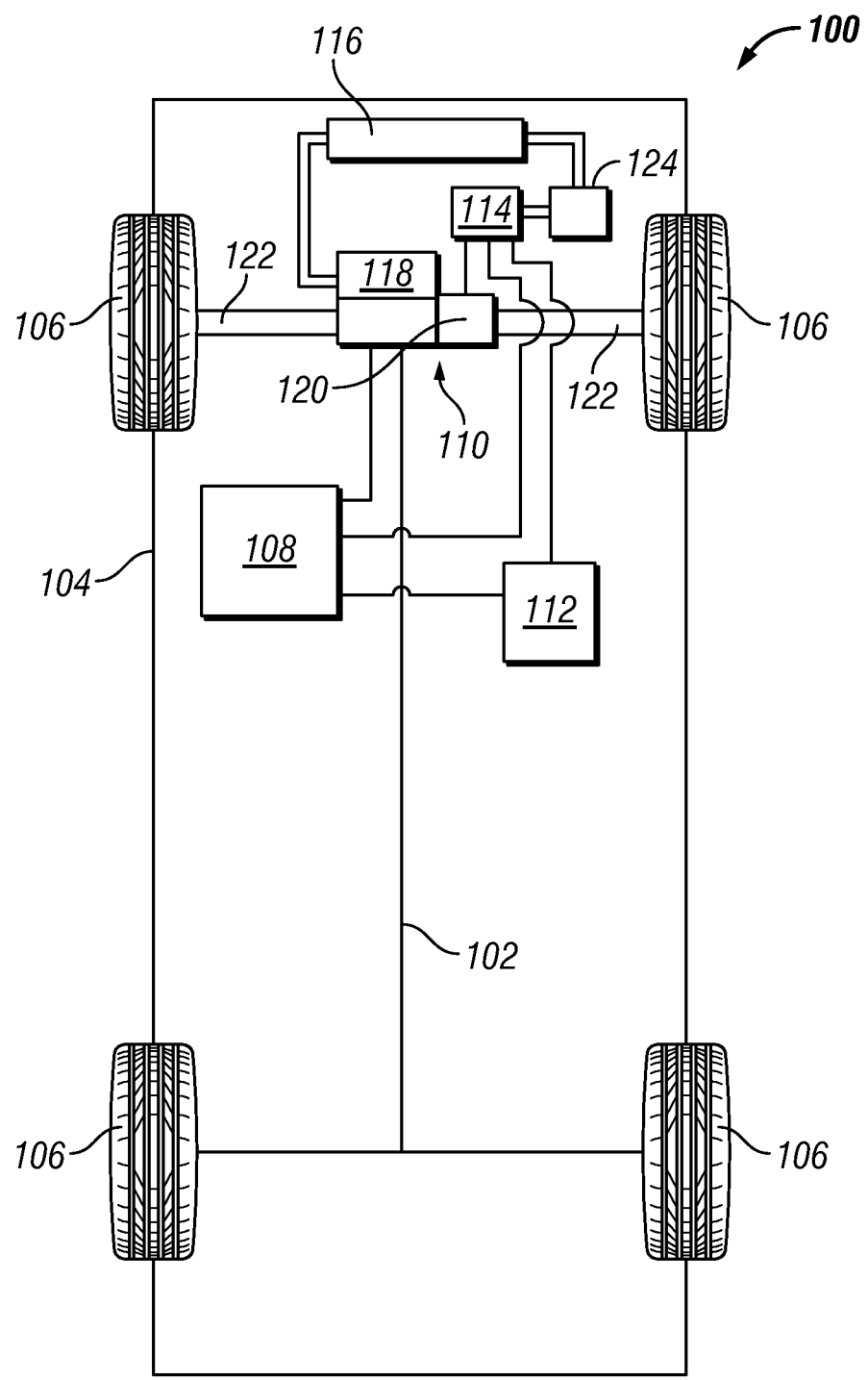
FIG. 1 is a schematic view of an automobile with an inverter assembly in accordance with an exemplary embodiment.

FIG. 1 illustrates an automobile (or vehicle) 100 according to one exemplary embodiment. The automobile 100 includes a chassis 102, a body 104, four wheels 106, and an electronic control system 108. The body 104 is arranged on the chassis 102 and substantially encloses the other components of the automobile 100. The wheels 106 are each rotationally coupled to the chassis 102 near a respective corner of the body 104.

The automobile 100 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 100 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 100 is a hybrid vehicle, and further includes an actuator assembly 110, a battery 112, a power inverter assembly 114, and a radiator 116. The actuator assembly 110 includes a combustion engine 118 and an electric motor 120. Although not illustrated, the electric motor 120 may include a transmission, a stator assembly, and a rotor assembly.

Still referring to FIG. 1, in one embodiment, the combustion engine 118 and the electric motor 120 are integrated such that both are mechanically coupled to at least some of the wheels 106 through one or more drive shafts 122. Although not illustrated in detail, the radiator 116 includes multiple cooling channels therethrough that contain a coolant, such as water and/or antifreeze such as ethylene glycol, and is coupled to the combustion engine 118 and the inverter assembly 114 through a pump 124. In the depicted embodiment, the inverter assembly 124 receives and shares coolant with the electric motor 120. The electronic control system 108 is in operable communication with the actuator assembly 110, the battery 112, and the inverter assembly 114 to provide control signals to one or more of the automobile components.

During operation, the automobile 100 is operated by providing power to the wheels 106 with the combustion engine 118 and the electric motor 120 in an alternating manner and/or with the combustion engine 118 and the electric motor 120 simultaneously. In order to power the electric motor 120, DC power is provided from the battery 112 to the inverter assembly 114, which converts the DC power into AC power, before the power is provided to the electric motor 120. Other embodiments may utilize the inverter assembly 114 described herein in types of automobiles other than hybrid vehicles and in conjunction with other electrical systems, such as a power steering system or an air conditioning system. The inverter assembly 114 may also be used in vehicles other than automobiles, such as aircraft and watercraft, or any system with multiple electrical systems that requires a power conversion.

In any event, as the inverter assembly 114 is operated, heat is generated by the semiconductor devices within a power module assembly. As noted above, in order to remove heat, coolant is circulated by the pump 124 within the inverter assembly 114. Heat from the power module assembly is conducted to the coolant, which is then pumped back to the radiator 116 to be cooled therein. The power module assembly, and particularly the cooling of the power assembly, will now be discussed in greater detail.

Figure 2:
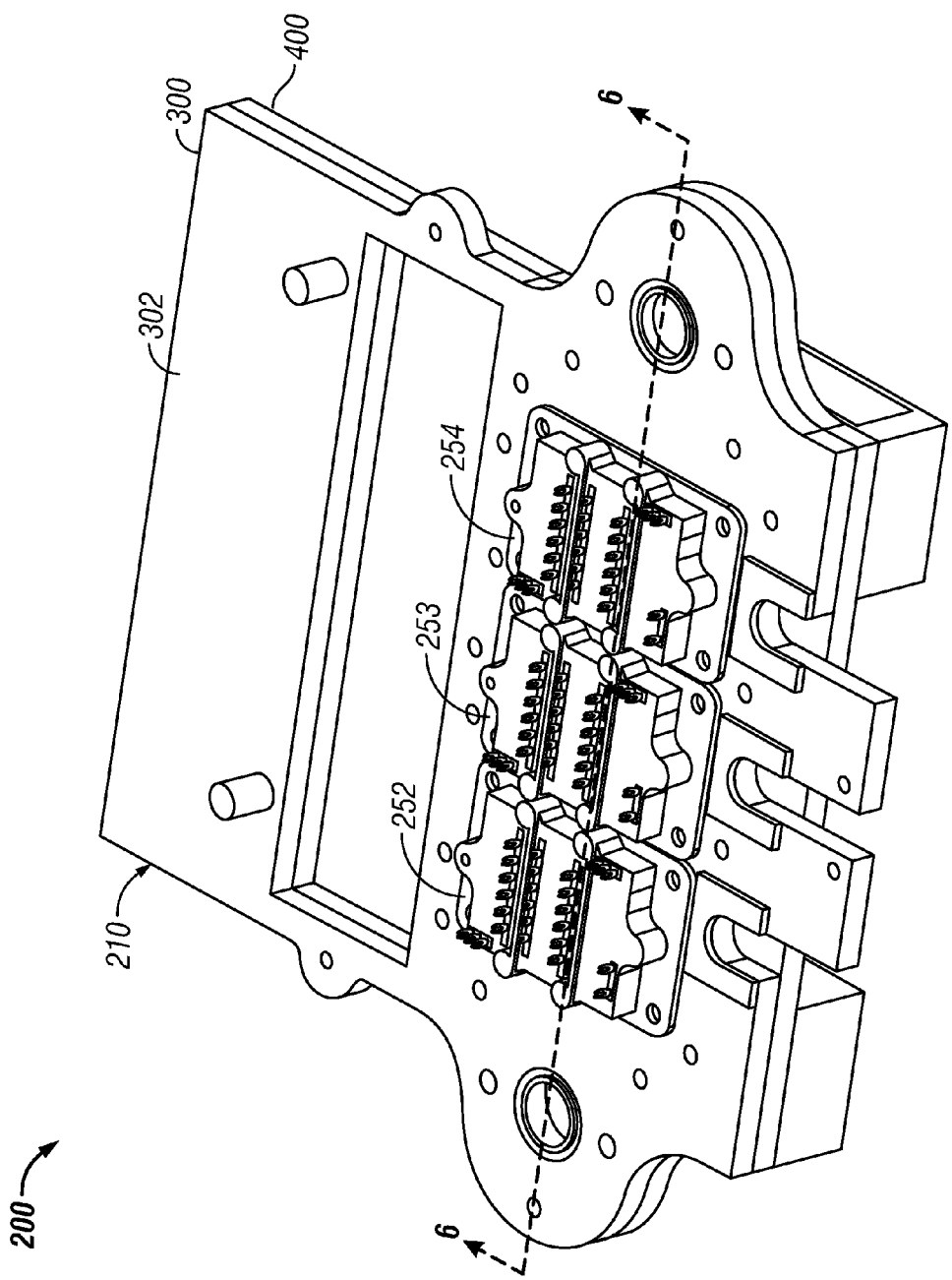
FIG. 2 is a top isometric view of a power module assembly of the inverter assembly of FIG. 1.
Figure 3:
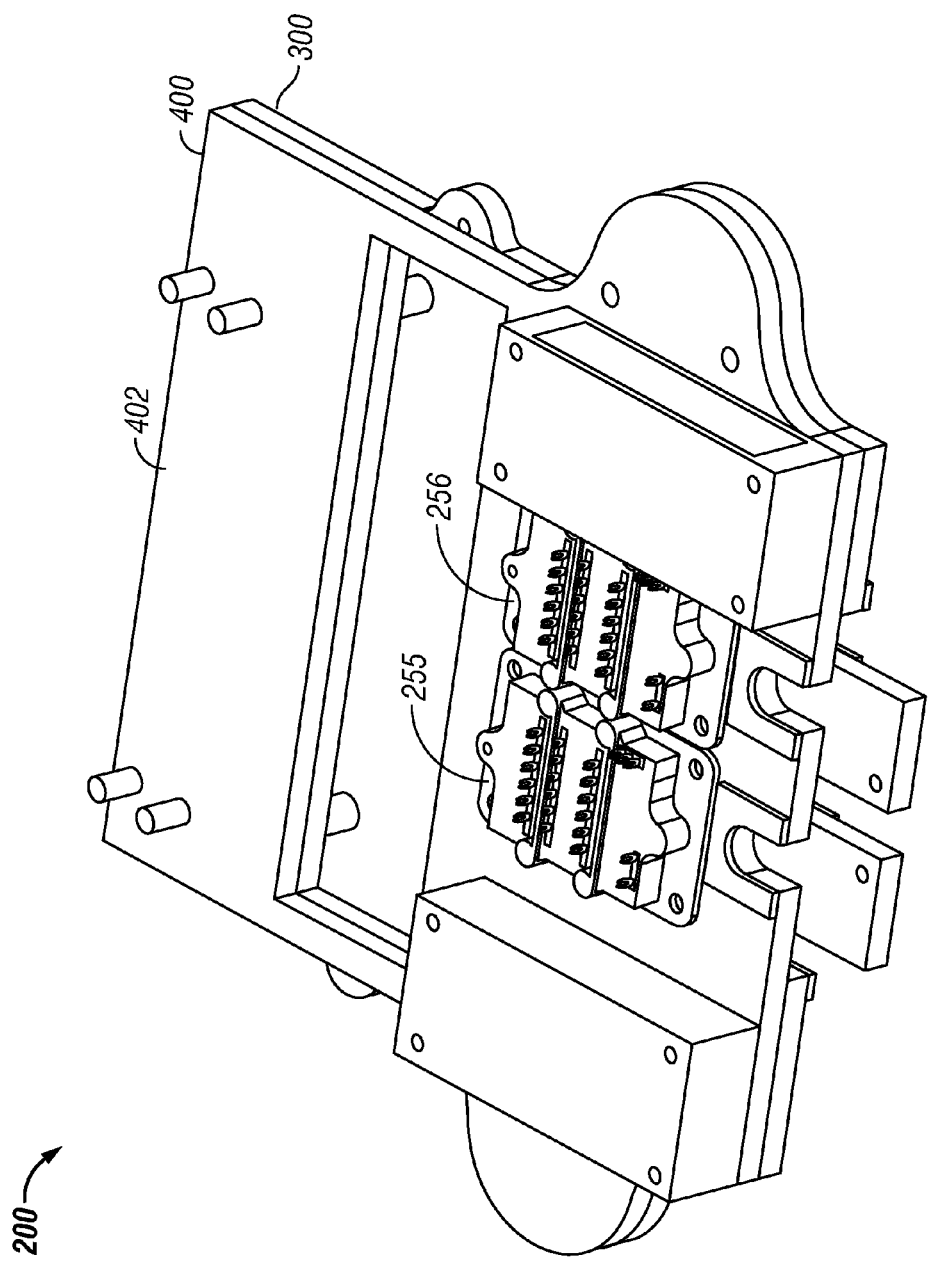
FIG. 3 is a bottom isometric view of the power module assembly of the inverter assembly of FIG. 1.

FIG. 2 is a top isometric view of a power module assembly 200 such as that used in the inverter assembly 114 of the automobile 100 of FIG. 1, and FIG. 3 is a bottom isometric view of the power module assembly 200. As noted above, one or more power module assemblies 200 and associated components may be enclosed in a housing to form the inverter assembly 114 (FIG. 1). Generally, the power module assembly 200 is formed by a number of power modules 202, 203, 204, 205, 206 mounted on a manifold 210. Other components of the power module assembly 200 may include a controller, sensors, and other electrical and mechanical components.

Figure 4:
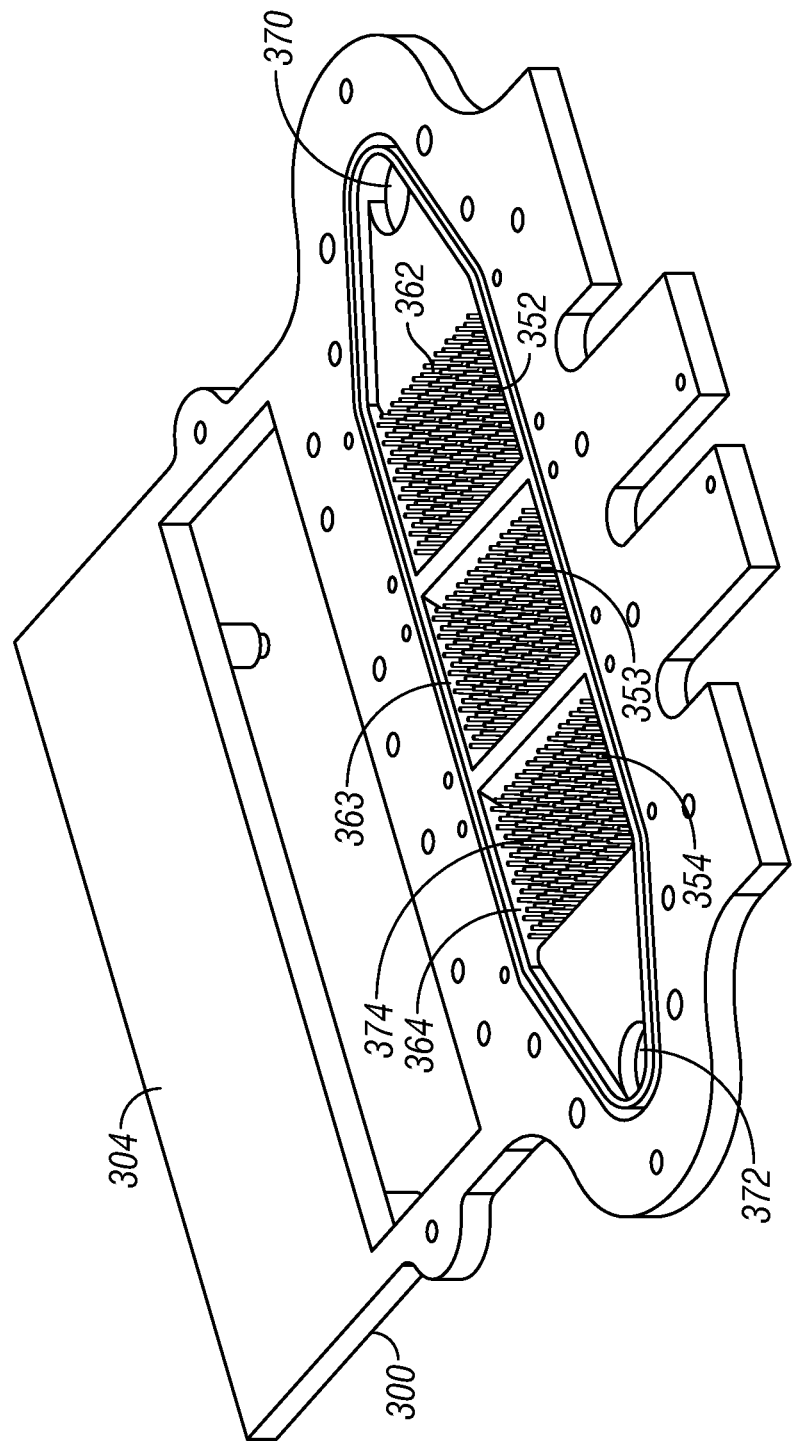
FIG. 4 is an isometric view of a first manifold section of the power module assembly of FIGS. 2 and 3.

In the exemplary embodiment of FIGS. 3 and 4, five power modules 252-256 may be provided, although the number may vary. Generally, the power modules 252-256 generally include an electronic component, such as a microelectronic die, although other substrates and/or layers may form part of the power modules 252-256. The microelectronic die may include a semiconductor substrate (e.g., silicon substrate) with an integrated circuit formed thereon that includes one or more of the switches (e.g., power electronic switches) in the form of individual semiconductor devices, such as insulated gate bipolar transistors (IGBTs), as is commonly understood. IGBTs handle both high voltages and high currents with small die sizes and with relatively low "on" resistance. IGBTs can be switched rapidly, thereby making IGBTs useful as switches in three phase inverters for high power, alternating current motor applications, such as motors used to drive electric, hybrid and fuel cell vehicles. In other embodiments, other types of semiconductor devices may be used.

The manifold 210 is formed by a first manifold section 300 and a second manifold section 400. In the depicted embodiment, three power modules 252-254 are mounted on the first manifold section 300 and two power modules 255, 256 are mounted on the second manifold section 400. The power modules 252-256 may be mounted on the outer faces 302, 402 of the respective manifold section 300, 400. The power modules 252-256 are thus connected to the manifold 210 in a "back-to-back" configuration. The manifold 210 may be made of a metal, such as aluminum.

Figure 5:
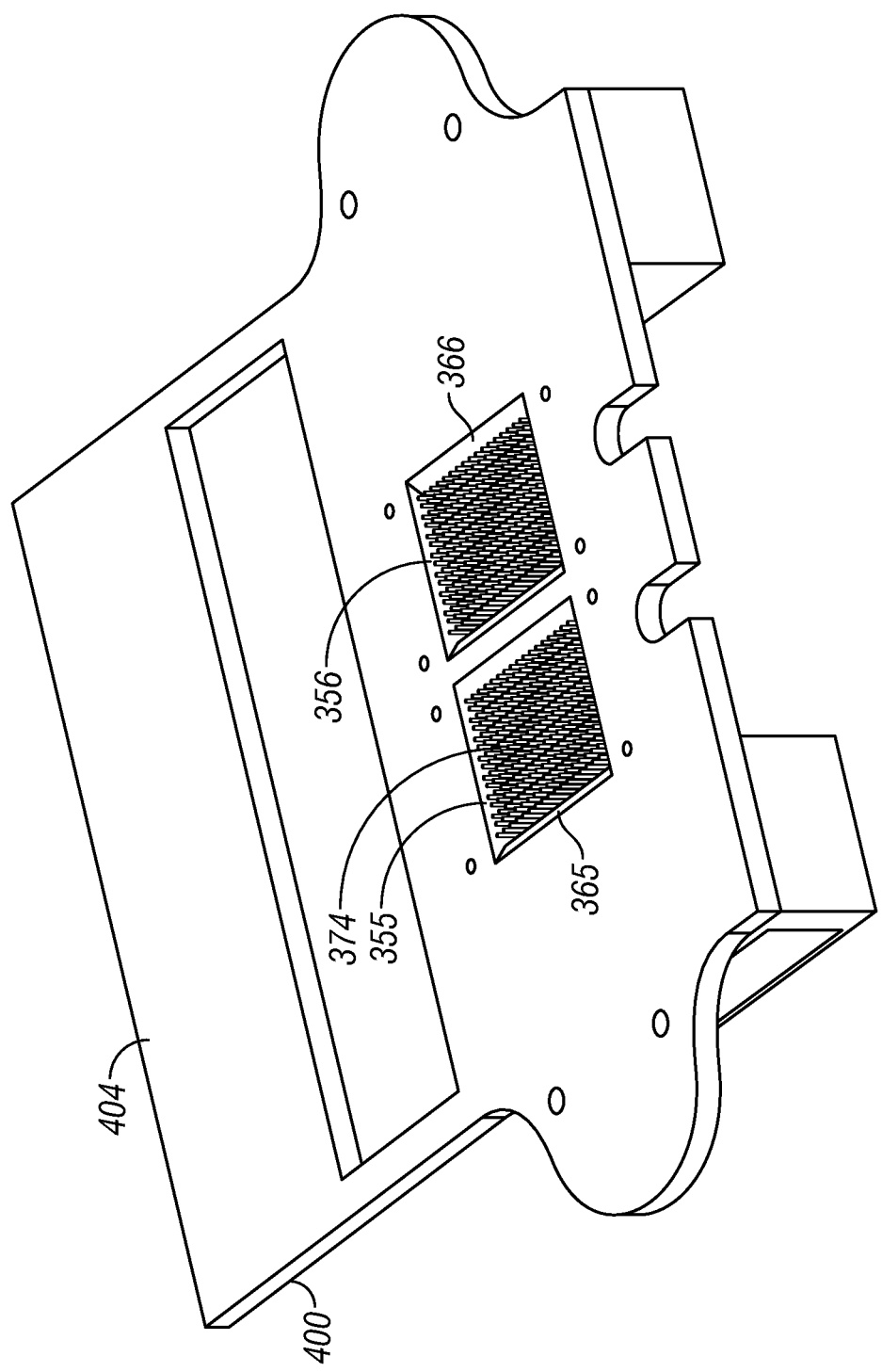
FIG. 5 is an isometric view of a second manifold section of the power module assembly of FIGS. 2 and 3.

The manifold sections 300, 400 are shown in more detail in FIGS. 4 and 5. FIG. 4 is an isometric view of a first manifold section 300 of the power module assembly 200, and FIG. 4 is an isometric view of a second manifold section 400 of the power module assembly 200. In particular, FIG. 4 illustrates the inner face 304 of the first manifold section 300, and FIG. 5 illustrates the inner face 404 of the second manifold section 400. The inner faces 304, 404 are coupled together to form the power module assembly 200 discussed above with reference to FIGS. 2 and 3.

As shown in FIG. 4, The inner face 304 of the first manifold section 300 defines a number of cavities 352, 353, 354. The positions of the cavities 352, 353, 354 generally correspond to the position of the power modules 252, 253, 254 mounted on the first face 302 (FIG. 2) of the first manifold section 300. A baseplate 362, 363, 364 is positioned in each cavity 352, 353, 354 and is thermally coupled to the respective power module 252, 253, 254. The first manifold section 300 further defines an inlet 370 and an outlet 372 for a coolant channel that is discussed in greater detail below.

Similarly, as shown in FIG. 5, the inner face 404 of the second manifold section 400 defines a number of cavities 355, 356. The positions of the cavities 355, 356 generally correspond to the position of the power modules 255, 256 mounted on the outer face 402 (FIG. 3) of the second manifold section 400. A baseplate 365, 366 is positioned in each cavity 355, 356 and is thermally coupled to the respective power module 255, 256.

Each of the baseplates 362-366 in the first and second module sections 300, 400 may have pin-fins 374 extending therefrom on the sides opposing the power modules 252-256. The pin-fins 374 may be made of a thermally conductive material, such as aluminum. As discussed in greater detail below, the flat surfaces of the baseplates 362-366 are placed in thermal contact with the power modules 252-256 (e.g., soldered to a substrate supporting the power module 252-256), and the pin-fins 374 are exposed to a coolant. During device operation, heat is conducted away from the power modules 252-256 and into the baseplates 362-366 and pin-fins 374, which are cooled by the coolant.

Figure 6:
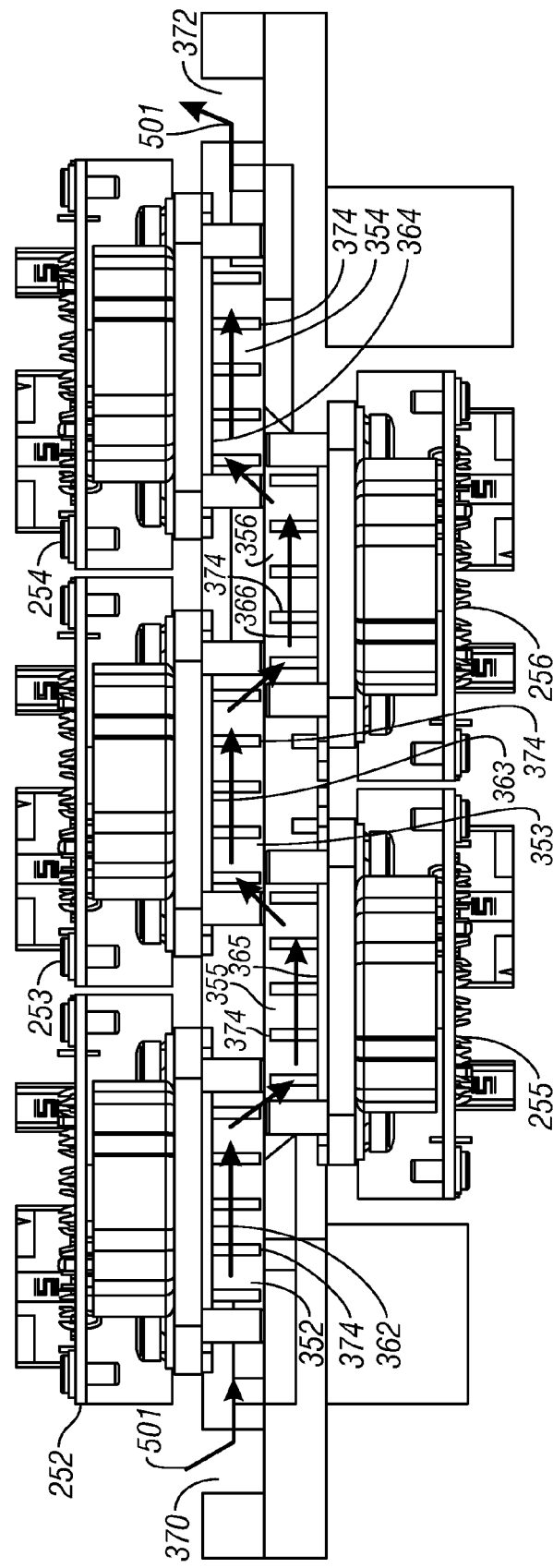
FIG. 6 is a cross sectional view of the power module assembly through line 6-6 in FIG. 2

As will now be discussed in greater detail, when the manifold sections 300, 400 are coupled together, the cavities 352-356 cooperate to form a coolant channel to cool the power modules 252-256. FIG. 6 is a cross-sectional view of the power module assembly 200 through line 6-6 in FIG. 2. In particular, FIG. 6 illustrates a coolant channel 500 formed by the cavities 352-356. As noted above, the coolant channel 500 is generally in fluid communication with the radiator 116 (FIG. 1), through the pump 124 (FIG. 1) to actively transport coolant through the coolant channel 500. In one exemplary embodiment, coupling of the manifold sections 300, 400 together seals off the coolant channel 500, thus obviating the need for additional fasteners and/or seals.

In the illustrated embodiment of FIG. 6, as indicated by arrows 501, the coolant channel 500 begins at inlet 370, through which coolant enters the power module assembly 200. The coolant then flows to the cavity 352 in the first manifold section 300, to the cavity 355 in the second manifold section 400, to the cavity 353 in the first manifold section 300, to the cavity 356 in the second manifold section 400, and to the cavity 354 in the first manifold section 300. The coolant channel 500 is completed as coolant exits through the outlet 372. As noted above, as coolant flows through the coolant channel 500, the coolant contacts the baseplates 362-366 to remove heat generated by the power modules 252-256. The pin-fins 374 extend into the coolant channel 500 and further assist heat transfer between the coolant and the baseplates 362-366. The sides of the respective cavities 352-356 may be angled or otherwise configured to direct coolant into subsequent cavities 352-356.

The alternating nature of the cavities 352-356 results in a "staggered" coolant channel 500. In other words, the portion of the coolant channel 500 in cavity 352 is in a first plane and the subsequent portion of the coolant channel 500 in cavity 355 is in a second plane. Further, subsequent cavities 353, 356, 354 along the coolant channel 500 also alternate between the first and second planes. More specifically, in the embodiment of FIG. 5, the cavities 352, 353, 354, of the first manifold section 300 have heights that do not overlap the heights of the cavities 355, 356 of the second manifold section 300 along a longitudinal direction, although in an alternate embodiment, the heights of the alternating cavities 352-356 may partially overlap. In one embodiment, the coolant flows in a generally straight direction along a longitudinal direction and the inlet 370 and outlet 372 on opposite sides, i.e., the coolant does not exhibit any 180° turns. Additionally, in one embodiment, the flow area of the coolant channel 500 within the cavities 352-356 is less than the flow area between cavities 352-356, which may result in a reduced pressure drop as the coolant moves the coolant channel 500.

One advantage of the power inverter described above is that because of the back-to-back configuration of the power modules 252-256, the coolant removes heat from multiple sides of the power module assembly 200 simultaneously. Moreover, the staggered coolant channel 500 results in more coolant directly contacting the baseplates 362-366. Thus, the cooling provided by the coolant is increased, which allows for the use of a coolant with an increased temperature and/or increased performance of the inverter assembly 114 (FIG. 1). Another advantage is that the overall size of the inverter is minimized. As a further advantage in this exemplary embodiment shown in FIGS. 2-6, the manifold may be manufactured without undercuts, i.e., a more simple manufacturing method that only requires two pulls, less machining, and fewer cored sections.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A manifold for supporting a power module assembly with a plurality of power modules, including first and second power modules, the manifold comprising:
   a first manifold section comprising a first face and a second face, the first face of the first manifold section receiving the first power module, the second face of the first manifold section defining a first cavity with a first baseplate thermally coupled to the first power module; and
   a second manifold section comprising a first face and a second face, the first face of the second manifold section receiving the second power module, the second face of the second manifold section defining a second cavity with a second baseplate thermally coupled to the second power module, the second face of the first manifold section and the second face of the second manifold section being coupled together such that the first cavity of the first manifold section and the second cavity of the second manifold section form a coolant channel, the first cavity of the first manifold section being at least partially staggered with respect to second cavity of the second manifold section,
   wherein the plurality of power modules further include a third power module, and wherein the second face of the first manifold section defines a third cavity with a third baseplate thermally coupled to the third power module, the third cavity of the first manifold forming a portion of the coolant channel such that coolant is directed from the first cavity of the first manifold section, to the second cavity of the second manifold section, and to the third cavity of the first manifold section.

2. The manifold of claim 1, wherein, during operation, the coolant channel directs coolant against the first baseplate of the first manifold section to remove heat from the first power module via the first baseplate and against the second baseplate of the second manifold section to remove heat from the second power module via the second baseplate.

3. The manifold of claim 1, further comprising pin-fins extending from the first baseplate into the first cavity.

4. The manifold of claim 1, wherein the first manifold section has first and second sides, and wherein the second face of the first manifold section defines a coolant inlet on the first side to direct the coolant into the coolant channel.

5. The manifold of claim 4, wherein the second face of the first manifold section further defines a coolant outlet on the second side to direct the coolant out of the coolant channel.

6. The manifold of claim 1, wherein the plurality of power modules further include a fourth power module, and wherein the second face of the second manifold section defines a fourth cavity with a fourth baseplate thermally coupled to the fourth power module, the fourth cavity of the fourth manifold forming a portion of the coolant channel such that coolant is directed from the first cavity of the first manifold section, to the second cavity of the second manifold section, to the third cavity of the first manifold section, and to the fourth cavity of the second manifold section.

7. The manifold of claim 6, wherein the plurality of power modules further include a fifth power module, and wherein the second face of the first manifold section defines a fifth cavity with a fifth baseplate thermally coupled to the fifth power module, the fifth cavity of the second manifold forming a portion of the coolant channel such that coolant is directed from the first cavity of the first manifold section, to the second cavity of the second manifold section, to the third cavity of the first manifold section, to the fourth cavity of the second manifold section, and to the fifth cavity of the first manifold section.

8. A power module assembly, comprising
a manifold; and
a plurality of power modules mounted on the manifold, the manifold defining a staggered coolant channel through which coolant flows to remove heat from the plurality of power modules,
wherein the power modules include first and second power modules,
wherein the manifold comprises:
a first manifold section with an inner face and an outer face, the first power module mounted on the outer face of the first manifold section, the inner face of the first manifold section defining a first cavity with a first baseplate thermally coupled to the first power module; and
a second manifold section comprising a first face and a second face, the first face of the second manifold section receiving the second power module, the second face of the second manifold section defining a second cavity with a second baseplate thermally coupled to the second power module, the second face of the first manifold section and the second face of the second manifold section being coupled together such that the first cavity of the first manifold section and the second cavity of the second manifold section form the staggered coolant channel, and
wherein the plurality of power modules further include a third power module, and wherein the second face of the first manifold section defines a third cavity with a third baseplate thermally coupled to the third power module, the third cavity of the first manifold forming a portion of the staggered coolant channel such that coolant is directed from the first cavity of the first manifold section, to the second cavity of the second manifold section, and to the third cavity of the first manifold section.

9. The power module assembly of claim 8, wherein the first cavity has a first height and the second cavity has a second height, the first and second heights being completely offset with respect to one another in a longitudinal direction.

10. The power module assembly of claim 8, wherein, during operation, the staggered coolant channel directs coolant against the first baseplate of the first manifold section to remove heat from the first power module via the first baseplate and against the second baseplate of the second manifold section to remove heat from the second power module via the second baseplate.

11. The power module assembly of claim 8, further comprising pin-fins extending from the first baseplate into the first cavity.

12. The power module assembly of claim 8, wherein the first manifold section has first and second sides, and wherein the second face of the first manifold section defines a coolant inlet to direct the coolant into the staggered coolant channel.

13. The power module assembly of claim 12, wherein the second face of the first manifold section further defines a coolant outlet on the second side to direct the coolant out of the staggered coolant channel.

14. The power module assembly of claim 8, wherein the plurality of power modules further include a fourth power module, and wherein the second face of the second manifold section defines a fourth cavity with a fourth baseplate thermally coupled to the fourth power module, the fourth cavity of the fourth manifold forming a portion of the staggered coolant channel such that coolant is directed from the first cavity of the first manifold section, to the second cavity of the second manifold section, to the third cavity of the first manifold section, and to the fourth cavity of the second manifold section.

15. The power module assembly of claim 14, wherein the plurality of power modules further include a fifth power module, and wherein the second face of the first manifold section defines a fifth cavity with a fifth baseplate thermally coupled to the fifth power module, the fifth cavity of the second manifold forming a portion of the staggered coolant channel such that coolant is directed from the first cavity of the first manifold section, to the second cavity of the second manifold section, to the third cavity of the first manifold section, to the fourth cavity of the second manifold section, and to the fifth cavity of the first manifold section.

16. The power module assembly of claim 8, wherein the plurality of power modules form an automobile power inverter.

17. A manifold for supporting a power module assembly with a plurality of power modules, including first, second, third, fourth, and fifth power modules, the manifold comprising:
a first manifold section comprising a first face and a second face, the first face of the first manifold section receiving the first, second, and third power modules,
the second face of the first manifold section defining
first cavity with a first baseplate thermally coupled to the first power module,
a second cavity with a second baseplate thermally coupled to the second power module, and
a third cavity with a third baseplate thermally coupled to the third power module; and
a second manifold section comprising a first face and a second face, the first face of the second manifold section receiving the second and third power modules, the second face of the second manifold section defining
a fourth cavity with a fourth baseplate thermally coupled to the fourth power module, and
a fifth cavity with a fourth baseplate thermally coupled to the fifth power module,
wherein the first, second, third, fourth, and fifth cavities form a staggered coolant channel such that coolant is directed from the first cavity, to the fourth cavity, to the second cavity, to the fifth cavity, and to the third cavity.

* * * * *